(12) United States Patent
Sahota (10) Patent No.: US 12,081,184 B1
(45) Date of Patent: Sep. 3, 2024

(54) CURRENT-MODE FILTER

(71) Applicant: QUALCOMM Incorporated, San Diego, CA (US)

(72) Inventor: Gurkanwal Singh Sahota, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/188,981

(22) Filed: Mar. 23, 2023

(51) Int. Cl.
*H03K 5/125* (2006.01)
*H03F 3/45* (2006.01)
*H03H 11/02* (2006.01)
*H03K 5/1252* (2006.01)
*H04B 1/04* (2006.01)

(52) U.S. Cl.
CPC ......... *H03H 11/02* (2013.01); *H03F 3/45479* (2013.01); *H03K 5/1252* (2013.01); *H04B 1/0475* (2013.01)

(58) Field of Classification Search
CPC .... H03K 5/125; H03K 5/1252; H04B 1/0017; H04B 1/0042; H04B 1/04; H04B 1/0475; H03H 7/0107; H03H 7/0153; H03H 7/0161; H03H 2007/0192; H03H 11/02; H03H 11/04; H03H 11/0405; H03H 11/0427; H03H 11/0461; H03H 11/0466; H03H 11/0472; H03H 11/12; H03H 2011/0477; H03H 2011/0494; H03F 3/45479
See application file for complete search history.

(56) References Cited

U.S. PATENT DOCUMENTS 5,686,861 A * 11/1997 Shou .................. H03H 11/04
327/344
6,483,380 B1 11/2002 Molnar et al.
7,130,579 B1 10/2006 Rael et al.
9,705,474 B2 * 7/2017 Koide .................. H03F 3/211

OTHER PUBLICATIONS

International Search Report and Written Opinion—PCT/US2024/017625—ISA/EPO—Jun. 27, 2024.
Mahattanakul J., et al., "Current-mode Versus Voltage-mode Gm-c Biquad Filters: What the Theory Says", IEEE Transactions on Circuits and Systems II: Analog and Digital Signal Processing, Institute of Electrical and Electronics Engineers Inc, 345 East 47 Street, New York, 10017, USA, vol. 45, No. 2, Feb. 1, 1998, pp. 173-186, XP000771363, esp. Fig. 3.

* cited by examiner

*Primary Examiner* — Long Nguyen
(74) *Attorney, Agent, or Firm* — Patterson & Sheridan LLP (57) ABSTRACT

Aspects of the present disclosure provide techniques and apparatus for current-mode analog signal filtering. An example filter circuit generally includes a current-mode amplifier. The current-mode amplifier includes a first amplifier including an input and an output; a first inverter including an input coupled to the output of the first amplifier and including an output coupled to a first feedback path, the first feedback path being coupled to a first input of the filter circuit; and a second inverter including an input coupled to the output of the first amplifier.

29 Claims, 8 Drawing Sheets

CURRENT-MODE FILTER

BACKGROUND

Field of the Disclosure

Certain aspects of the present disclosure generally relate to electronic circuits and, more particularly, to current-mode amplifiers and filter circuits using such amplifiers.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. Wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., IEEE 802.11), and the like.

Wireless communication devices may include one or more filter circuits, which may be implemented as low-pass filters or bandpass filters, for example. Such filter circuits may be used to filter baseband (BB) signals, intermediate frequency (IF) signals, and/or radio frequency (RF) signals (e.g., signals at frequencies for wireless transmission).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages for a filter circuit that include a reduced power supply voltage and/or a reduced size.

Certain aspects of the present disclosure generally relate to current-mode amplifiers and to filter circuits and other circuits utilizing such current-mode amplifiers.

Certain aspects of the present disclosure provide a filter circuit. The filter circuit generally includes a current-mode amplifier. The current-mode amplifier includes a first amplifier including an input and an output; a first inverter including an input coupled to the output of the first amplifier and including an output coupled to a first feedback path, the first feedback path being coupled to a first input of the filter circuit; and a second inverter including an input coupled to the output of the first amplifier.

Certain aspects of the present disclosure provide a method of processing a signal. The method generally includes receiving a signal at a first input of a filter circuit and filtering the signal to generate a filtered signal at an output of the filter circuit. The filter circuit includes a current-mode amplifier comprising a first amplifier including an input and an output. The current-mode amplifier further comprises a first inverter including an input coupled to the output of the first amplifier and including an output coupled to a first feedback path, the first feedback path being coupled to the first input of the filter circuit; and a second inverter including an input coupled to the output of the first amplifier.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to apparatus and methods for current-mode analog signal filtering and a current-mode amplifier for use in filter circuits and various other suitable electronic circuits.

A wireless communication device may include a transceiver (also referred to as a radio frequency front-end (RFFE) circuit or RF transceiver circuit) for transmitting and/or receiving RF signals. As an example, high performance transceivers (e.g., a 5G New Radio (NR) receiver and/or IEEE 802.11 receiver) may use filters as a blocker and/or to provide anti-alias filtering for an analog-to-digital converter (ADC). In some cases, a resistor-capacitor (RC) filter may be used as the filter in a transceiver to provide certain linearity characteristics. An active RC filter may use an operational amplifier (e.g., with a large gain-bandwidth (GBW) product) to provide a biquadratic filter or other filter topologies.

In an active RC filter circuit, the capacitors may be connected in a single-ended fashion to a reference potential node, such as ground. In such a single-ended version, the capacitance is relatively large (e.g., four times larger) compared to capacitors used in a differential version to realize the same pole(s). For an active RC filter, the filter bandwidth may depend on the operational amplifier bandwidth (and/or GBW product). For example, the filter bandwidth may be designed to be less than the bandwidth of the operational amplifier in order to provide stability and/or avoid peaking in the frequency response resulting in higher power dissipation. The capacitors and operational amplifiers may typically occupy most of the area of the filter circuit. Due to the physical sizes of the capacitors (proportional to the capacitance) and operational amplifiers, these components can also contribute to the cost of fabricating the filter circuit and corresponding transceiver. In addition, the operational amplifier relies on a certain minimum power supply voltage, such as 0.8 to 1.8 volts. Thus, the active RC filter circuit can have certain design characteristics that affect the size, cost, and/or supply voltage (among other characteristics) of the transceiver.

Certain aspects of the present disclosure provide a current-mode amplifier and methods and apparatus for current-mode analog signal filtering using such an amplifier. An example filter circuit may have a current-mode amplifier in a single-ended architecture and/or a differential architecture. For example, the filter circuit may include a differential current amplifier having a differential current output pair coupled to a passive network, such as an RC filter, resistor-inductor (RL) filter, inductor-capacitor (LC) filter, RLC filter, or the like. In some cases, the filter circuit may have a diplex design such as a composite low-pass and bandpass filter allowing a carrier in the low-pass passband and another carrier in the bandpass passband. The current-mode amplifier may allow the filter circuit to operate at lower voltages (e.g., less than or equal to 0.8 volts, such as 0.75 V) compared to other filters, such as an active RC filter. The current-mode amplifier has a low input impedance and high output impedance. In a differential filter design, the high impedance differential output allows for a differential capacitor connection in the filter topology, such that the capacitor(s) can have reduced size compared to a single-ended design. It will be appreciated that the current-mode amplifiers described herein may be used for other circuits, such as a variable gain amplifier (VGA).

The methods and apparatus for current-mode analog signal filtering described herein may provide various advantages. For example, the methods and apparatus for current-mode analog signal filtering described herein may allow for a filter circuit to operate at low voltages (e.g., power supply voltages less than or equal to 0.8 volts), which may reduce the power consumption of the transceiver. The reduced power supply voltages associated with the filter circuit may allow the integrated circuit to reduce the number of supply voltage domains configured on the chip. The methods and apparatus for current-mode analog signal filtering described herein may allow for a differential capacitor to be used in the filter circuit, and the differential capacitor may have a smaller capacitance compared to a capacitor in a single-ended filter circuit, such as an active RC filter. As a result, the filter circuit described herein may have a reduced physical size compared to an active RC filter, and such a size reduction may further reduce the fabrication costs or allow for other resources to be designed for the transceiver, for example. The reduced size of the filter circuit may be advantageous for certain integrated circuit fabrication processes, such as 6 nanometer (nm) or smaller processes.

Example RF Transceiver

Figure 1:
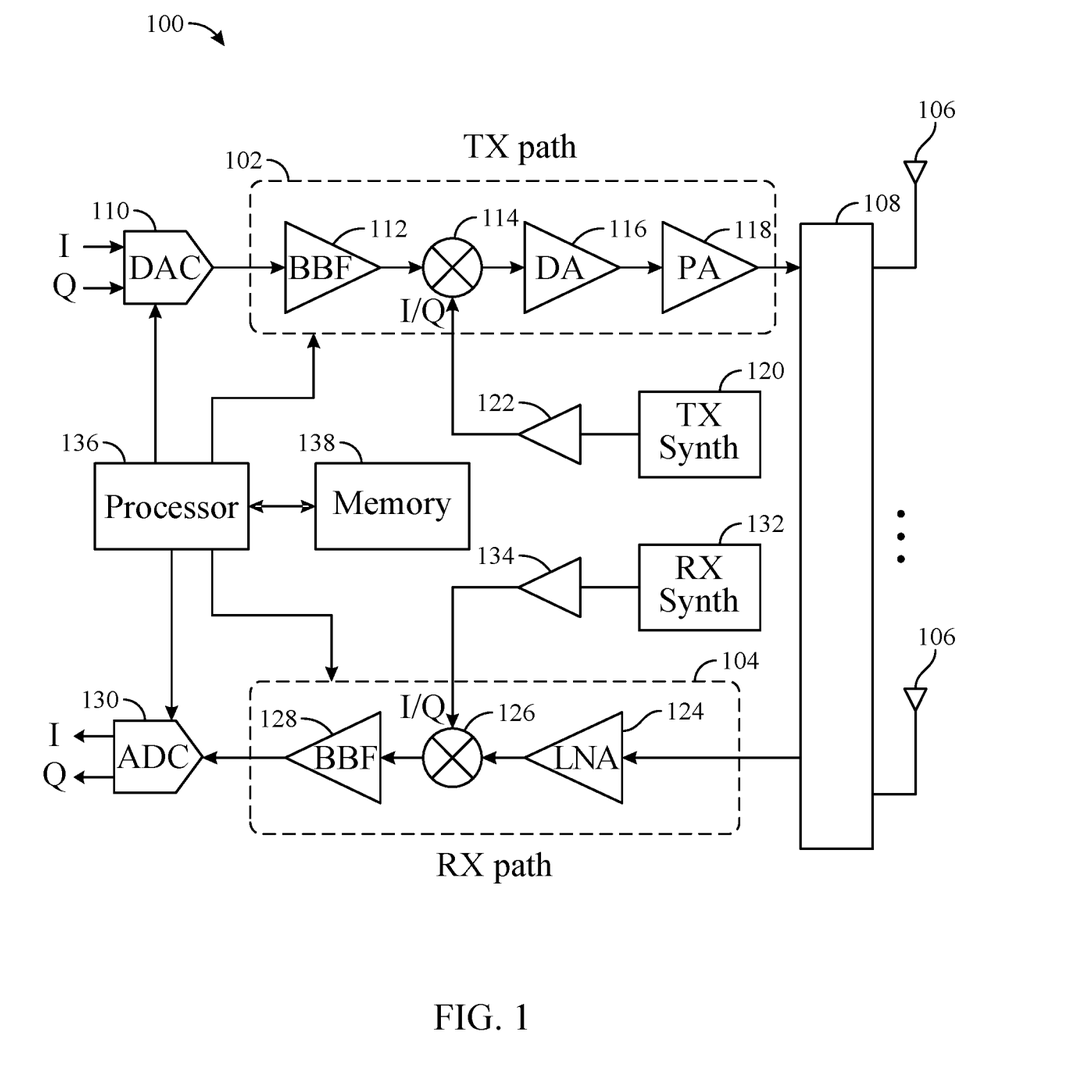
FIG. 1 is a block diagram of an example radio frequency transceiver.

FIG. 1 is a block diagram of an example RF transceiver circuit 100, in accordance with certain aspects of the present disclosure. The RF transceiver circuit 100 includes at least one transmit (TX) path 102 (also known as a "transmit chain") for transmitting signals via one or more antennas 106 and at least one receive (RX) path 104 (also known as a "receive chain") for receiving signals via the antennas 106. When the TX path 102 and the RX path 104 share an antenna 106, the paths may be connected with the antenna via an interface 108, which may include any of various suitable RF devices, such as a switch, a duplexer, a diplexer, a multiplexer, and the like.

Receiving in-phase (I) or quadrature (Q) baseband analog signals from a digital-to-analog converter (DAC) 110, the TX path 102 may include a baseband filter (BBF) 112, a mixer 114, a driver amplifier (DA) 116, and a power amplifier (PA) 118. The BBF 112, the mixer 114, the DA 116, and the PA 118 may be included in a radio frequency integrated circuit (RFIC), for certain aspects. For other aspects, the PA 118 (and/or other components) may be external to the RFIC. In certain aspects, the BBF 112 may be implemented as a filter circuit including one or more current-mode amplifiers as further described herein with respect to FIGS. 2-6. Such a BBF with at least one current-mode amplifier may allow for a reduced power supply voltage (e.g., less than or equal to 0.8 volts) and/or reduced circuit size, for example, compared to at least some BBF implementations.

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 114 are typically RF signals, which may be amplified by the DA 116 and/or by the PA 118 before transmission by the antenna 106.

The RX path 104 may include a low noise amplifier (LNA) 124, a mixer 126, and a baseband filter (BBF) 128. The LNA 124, the mixer 126, and the BBF 128 may be included in a RFIC, which may or may not be the same RFIC that includes the TX path components. RF signals received via the antenna 106 may be amplified by the LNA 124, and the mixer 126 mixes the amplified RF signals with a receive local oscillator (LO) signal to convert the RF signal of interest to a different baseband frequency (e.g., downconvert). The baseband signals output by the mixer 126 may be filtered by the BBF 128 before being converted by an analog-to-digital converter (ADC) 130 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 120, which may be buffered or amplified by amplifier 122 before being mixed with the baseband signals in the mixer 114. Similarly, the receive LO may be produced by an RX frequency synthesizer 132, which may be buffered or amplified by amplifier 134 before being mixed with the RF signals in the mixer 126. For certain aspects, a single frequency synthesizer may be used for both the TX path 102 and the RX path 104.

A processor 136 may control the operation of the RF transceiver circuit 100, such as controlling the transmission of signals via the TX path 102 and/or controlling the reception of signals via the RX path 104. In certain aspects, the processor 136 may perform operations further described herein related to current-mode analog signal filtering, such as controlling aspects of the filter including gain, phase, center frequency, bandwidth, etc. The processor 136 may include a modem, a microcontroller, a microprocessor, an application processor, a neural processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 138 may store data and program codes (e.g., computer-executable instructions) for operating the RF transceiver circuit 100.

While FIG. 1 provides an RF transceiver as an example application in which certain aspects of the present disclosure may be implemented to facilitate understanding, certain aspects described herein related to current-mode analog signal filtering and current-mode amplifiers may be utilized in various other suitable electronic systems.

Example Current-Mode Amplifiers

Figure 2:
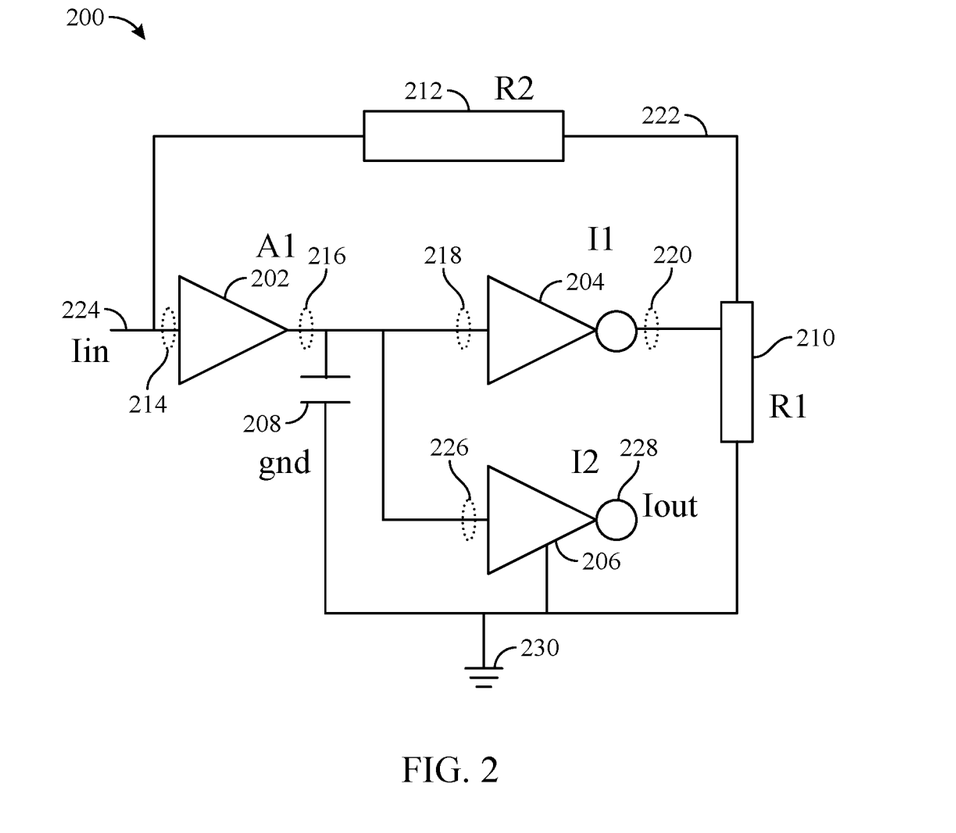
FIG. 2 is a diagram illustrating an example single-ended current-mode amplifier.

FIG. 2 is a block diagram of an example current-mode amplifier 200. The current-mode amplifier 200 is configured to receive an input current (Iin) and generate an output current (Iout), which in some cases may be amplified compared to Iin, where current (rather than voltage) may be the information-carrying signal, for example, in a TX path and/or RX path. In this example, the current-mode amplifier 200 is implemented as a single-ended version referenced to a reference potential node 230 (e.g., electrical ground). The current-mode amplifier 200 comprises a first amplifier 202 (labeled "A1"), a first inverter 204 (labeled "I1"), and a second inverter 206 (labeled "I2"). In some cases, the current-mode amplifier comprises a capacitive element 208, a first resistive element 210 (labeled "R1"), and a second resistive element 212 (labeled "R2"). The first resistive element 210 and the second resistive element 212 may be used to configure or adjust the gain of the current-mode amplifier 200, for example.

The first amplifier 202 may include or be implemented as a current buffer, a current amplifier, and/or an inverter, as further described herein. The first amplifier 202 includes an input 214 and an output 216.

Any of the first inverter 204 and the second inverter 206 may include any of various suitable logic inverters, e.g., a complementary metal-oxide-semiconductor (CMOS) inverter or any other transistor-level inverter. The first inverter 204 includes an input 218 coupled to the output 216 of the first amplifier 202 and includes an output 220 coupled to a first feedback path 222. In this example, the first feedback path 222 is coupled to the input 224 (labeled "Iin") of the current-mode amplifier 200 (and to the input 214 of the first amplifier 202). Together, the cascaded first amplifier 202 and the first inverter 204 may effectively form a gyrator, which is a two-port device that cross-couples the input voltage to the output current and the input current to the output voltage, as further described herein. The second inverter 206 includes an input 226 coupled to the output 216 of the first amplifier 202 and includes an output 228, which is also the output (labeled "Tout") of the current-mode amplifier 200.

The capacitive element 208 may be representative of the internal capacitance associated with the first amplifier 202, the first inverter 204, and/or the second inverter 206. For example, the capacitive element 208 may represent the gate-to-source capacitance ($C_{gs}$) of the first inverter 204 and/or the second inverter 206 as well as the drain-to-source capacitance ($C_{ds}$) of the first amplifier 202. The capacitive element 208 may be effectively coupled between the output 216 of the first amplifier 202 and the reference potential node 230.

The first resistive element 210 and/or the second resistive element 212 may include any of various resistors and/or other resistive devices, including an integrated resistor, a variable resistor, or a resistor network. The first resistive element 210 is coupled between the output 220 of the first inverter 204 and the reference potential node 230. The second resistive element 212 is coupled in series along the first feedback path 222. In this example, the second resistive element 212 is coupled between the output 220 of the first inverter 204 and the input 224 of the current-mode amplifier 200. For certain aspects, the first resistive element 210 may be an open circuit (e.g., the first resistive element 210 may be optionally omitted). In certain aspects, the second resistive element 212 may be a short circuit. In such cases, the gain of the amplifier may be based (solely or in part) on the ratio of the inverter sizes associated with the first inverter 204 and the second inverter 206.

The input impedance (Zin) of the current-mode amplifier 200 may be effectively equivalent to a series LR circuit, where the input impedance is low at low frequencies. The input current flows in the feedback inverter (e.g., the first inverter 204), and this current is mirrored by the second inverter 206 if the inverters are matched, due to the performance characteristics (e.g., the gate-to-source voltage (Vgs) value) of both inverters being effectively identical in this case. The current-mode amplifier 200 may provide very wide bandwidth, for example, due to the transition frequency of the inverters and amplifier.

The current gain of the current-mode amplifier can be modeled as follows:

$$Iout = \frac{I2}{I1} Iin$$

where Iout is the output current, Iin is the input current, and I2/I1 is the ratio of the inverter sizes (e.g., the ratio of the size of the second inverter 206 to the size of the first inverter 204). The unity gain frequency of the current-mode amplifier may be decreased as the gain is increased due to the larger gate-to-source capacitance (Cgs) of the second inverter. The current gain can be adjusted (e.g., increased or decreased) via the restive elements, where the current gain can be modeled as follows:

$$Iout = \frac{I2}{I1}\frac{R2+R1}{R1}Iin$$

where R1 is the resistance of the first resistive element 210, and R2 is the resistance of the second resistive element 212.

To keep the noise of the current-mode amplifier 200 relatively low, the transconductance (g m) of the inverters 204, 206 can be kept low. That is, the noise of the current-mode amplifier 200 may be proportional to the transconductance of the inverters 204, 206. Additionally or alternatively, the resistances of the resistive elements 210, 212 (e.g., R1/(R1+R2)) can be adjusted to reduce the noise of the second inverter 206. The current-mode amplifier 200 is effectively linear. If a direct-current (DC) offset voltage is present at the input of the current-mode amplifier, the current-mode amplifier 200 can still provide a linear output current.

Figure 3:
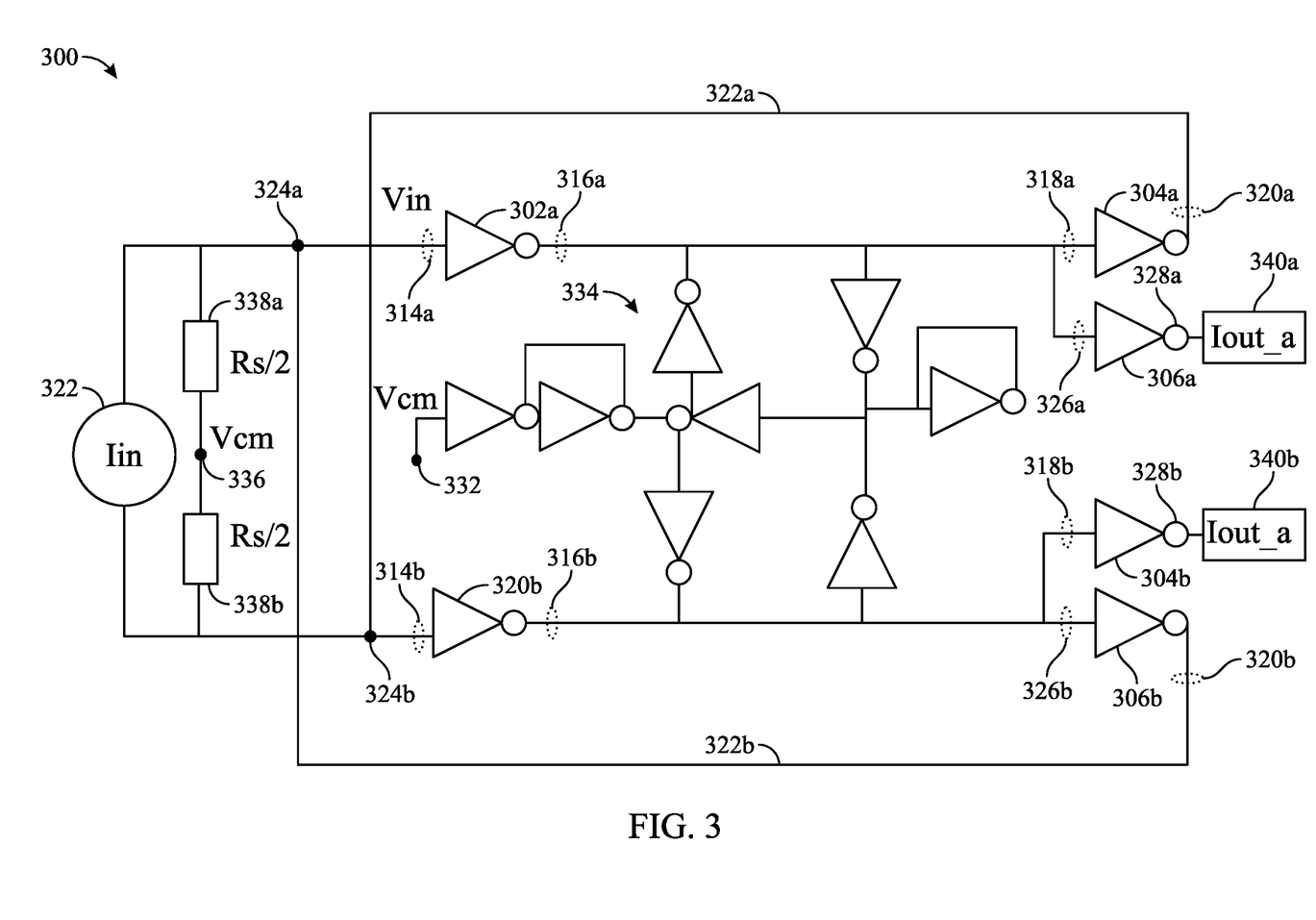
FIG. 3 is a diagram illustrating an example differential current-mode amplifier.

FIG. 3 is a diagram illustrating an example differential current-mode amplifier 300. In this example, the current-mode amplifier 300 includes a differential current input pair 324 (with complementary inputs 324a, 324b) and a differential current output pair 340 (with complementary outputs 340a, 340b). The input pair 324 is coupled to an input current source 332, which may be representative of any of various circuitry—such as any of the components in the TX path 102 and/or the RX path 104 and/or integrated with or included in any of those components. In certain aspects, the current-mode amplifier 300 may be configured as a gyrator circuit. For example, the current-mode amplifier 300 may be a two port device that cross-couples the input voltage to the output current and the input current to the output voltage. The instantaneous currents and voltages can be represented as:

$$V_{out}=RI_{in}$$

$$V_{in}=-RI_{out}$$

where Vin and Vout are the input and output voltages, respectively, of the current-mode amplifier 300, Iin and Iout are the input and output currents, respectively, of the current-mode amplifier 300, and R is the gyration resistance associated with the current-mode amplifier 300.

The current-mode amplifier 300 comprises a first amplifier 302a, a second amplifier 302b, a first inverter 304a, a second inverter 306a, a third inverter 304b, and a fourth inverter 306b. In this example, any of the first amplifier 302a and the second amplifier 302b may include or be implemented as an inverter, such as any of various suitable inverters (e.g., an inverting buffer).

The first amplifier 302a, the first inverter 304a, and the second inverter 306a are effectively arranged as described herein with respect to FIG. 2, except that the first feedback path 322a is cross-coupled with a second feedback path 322b and routed to the second input 324b of the current-mode amplifier 300. As one of the differential outputs, the output 328a of the second inverter 306a is coupled to the first output 340a of the differential current output pair 340. Likewise, the differential counterparts—the second amplifier 302b, the third inverter 304b, and the fourth inverter 306b—are effectively arranged as described herein with respect to FIG. 2, except that the second feedback path 322b is cross-coupled with the first feedback path 322a and routed to the first input 324a of the current-mode amplifier 300. That is, the first feedback path 322a is coupled between the output 320a of the first inverter 304a and the second input 324b of the current-mode amplifier 300, and the second feedback path 322b is coupled between the output 320b of the fourth inverter 306b and the first input 324a of the current-mode amplifier 300.

The second amplifier 302b includes an input 314b and an output 316b. The third inverter 304b includes an input 318b coupled to the output 316b of the second amplifier 302b. As the other differential output, the output 328b of the third inverter 304b is coupled to the second output 340b of the differential current output pair 340. The fourth inverter 306b includes an input 326b coupled to the output 316b of the second amplifier 302b and an output 320b coupled to the second feedback path 322b. The second feedback path 322b is coupled to the first input 324a of the current-mode amplifier 300.

The current-mode amplifier 300 may further include a common-mode feedback (CMFB) circuit 334 coupled between the output 316a of the first amplifier 302a and the output 316b of the second amplifier 302b. The CMFB circuit 334 may be configured to adjust (e.g., reduce or increase) the common-mode impedance at the output pair 340 of the current-mode amplifier 300. The CMFB circuit 334 may include an inverter bridge network coupled to a common-mode node 336. The common-mode node 336 may be coupled between resistive elements 338a, 338b, each having an equivalent resistance (e.g., Rs/2) such that the common-mode voltage (Vcm) is available at the common-mode node 336. If current-mode amplifiers are cascaded (e.g., a current-mode amplifier arranged in series with another current-mode amplifier), the subsequent stage's CMFB circuit may set the output common-mode voltage.

The resistive elements (e.g., the first resistive element 210 and the second resistive element 212) and compensation capacitor (e.g., the capacitive element 208) described with respect to FIG. 2 are not shown in this example, but may be added. In certain aspects, the first resistive element may be considered to have a resistance of infinity (e.g., R1=∞), and the second resistive element coupled along the feedback paths may be considered to have no resistance (e.g., R2=0).

Example Current-Mode Filters

Figure 4A:
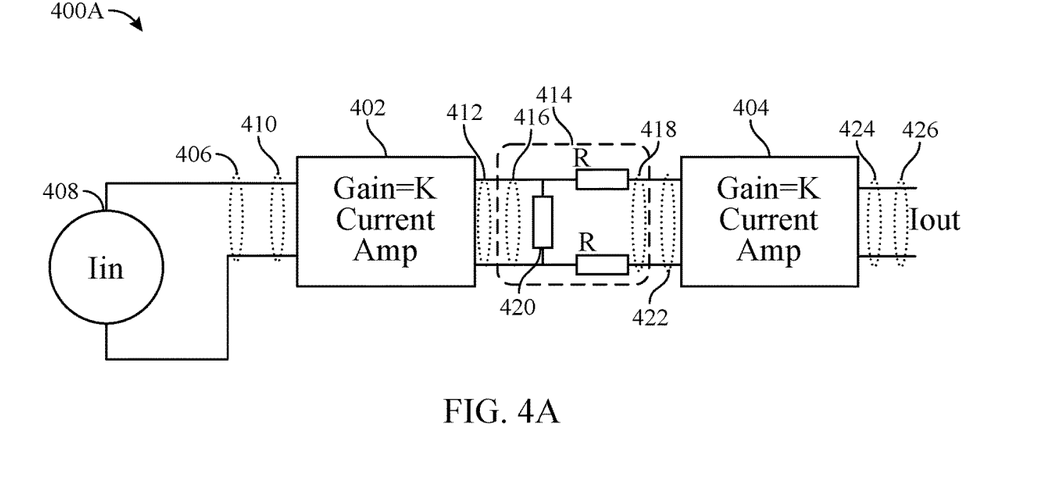
FIG. 4A is a diagram illustrating an example of a first-order filter circuit including differential current-mode amplifiers.

FIG. 4A is a diagram illustrating an example of a first-order filter circuit 400A including differential current amplifiers 402, 404. In this example, the filter circuit 400A includes a differential input pair 406 coupled to a current source 408, which, here too, may be any of various circuitry including components in an RF transceiver circuit. The filter circuit 400A includes a passive network 414.

Any of the differential current amplifiers 402, 404 may include the current-mode amplifier 300 or a variation of such an amplifier, such as cascaded amplifiers or a current amplifier with passive elements, such as elements described with respect FIG. 2. Any of the differential current amplifiers 402, 404 may be configured to have a variable current gain (gain=K), and the gains of the amplifiers 402, 404 may be configured to be the same or different. The variable current gain may be controlled by the processor 136, for example. The first differential current amplifier 402 includes a differential current input pair 410 and a differential current output pair 412. The differential current input pair 410 is coupled to the differential input pair 406 of the filter circuit 400A.

The passive network 414 may include any of various passive electrical components or devices, such as an RC network, RL network, LC network, RLC network, etc. In certain aspects, the passive network 414 may include tunable components, such as a variable resistor, a variable capacitor, and/or a variable inductor. The tunable components may be controlled by the processor 136. For example, the processor 136 may adjust the resistance, capacitance, and/or inductance associated with any of the tunable components. The passive network 414 includes a differential input pair 416 and a differential output pair 418. As shown, the passive network 414 includes an RC network having a shunt capacitive element 420 differentially coupled, for example, between the differential input pair 416 of the passive network 414 and series resistive elements. The differential coupling of the capacitive element 420 may allow the capacitance of the capacitive element 420 to be relatively lower compared to capacitors in other filter circuitry, such as a capacitor in an active RC filter. Such a reduced capacitance of the capacitive element 420 may reduce the cost and/or size of the filter circuit 400A compared to other filter circuits.

The second differential current amplifier 404 includes a differential current input pair 422 and a differential current output pair 424. The differential output pair 418 of the passive network 414 is coupled to the differential current input pair 422 of the second differential current amplifier 404. The differential current output pair 424 of the second differential current amplifier 404 is coupled to the differential output pair 426 of the filter circuit 400A.

Figure 4B:
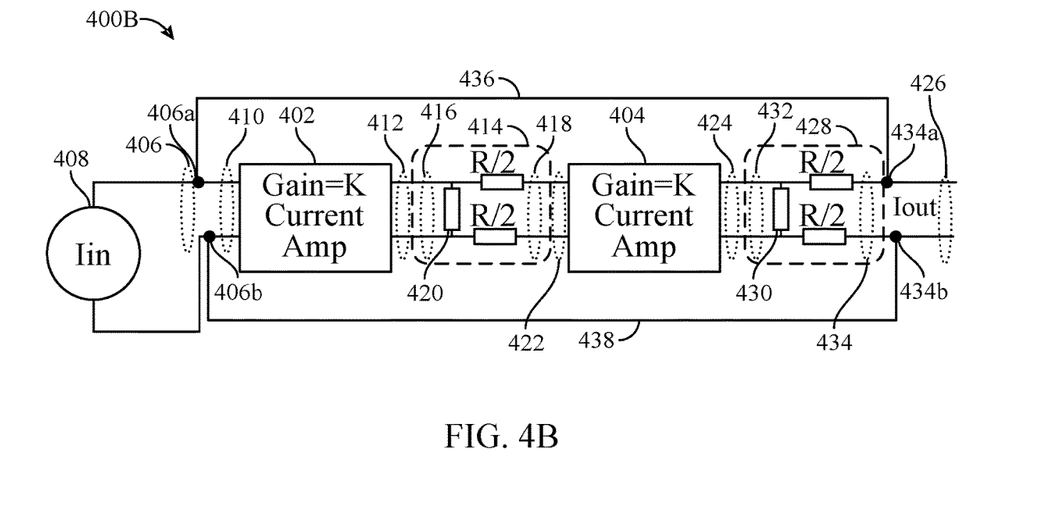
FIG. 4B is a diagram illustrating an example of a biquadratic filter circuit including the differential current-mode amplifiers.

FIG. 4B is a diagram illustrating an example of a biquadratic filter circuit 400B including the differential current amplifiers 402, 404. A biquadratic filter is a type of filter that implements a transfer function that is the ratio of two quadratic functions. The filter circuit 400B is an example of a second-order filter topology in a differential architecture.

In this example, the filter circuit 400B includes all of the components of the first-order filter circuit 400A as arranged in FIG. 4A. The filter circuit 400B also includes a second passive network 428. The second passive network 428 may include any of various passive electrical components or devices, such as an RC network, RL network, LC network, RLC network, etc. As depicted, the second passive network 428 includes an RC network having a shunt capacitive element 430 differentially coupled, for example, between the differential input pair 432 of the second passive network 428 and series resistive elements. The second passive network 428 includes the differential input pair 432 and a differential output pair 434. The differential input pair 432 of the second passive network 428 is coupled to the differential current output pair 424 of the second differential current amplifier 404.

In certain aspects, the filter circuit 400B may include feedback paths 436, 438. A first output 434a of the differential output pair 434 of the second passive network 428 is coupled to the first input 406a of the filter circuit 400B along a first feedback path 436. A second output 434b of the differential output pair 434 of the second passive network 428 is coupled to the second input 406b of the filter circuit 400B along a second feedback path 438.

The quality factor (Q) of the filter circuit 400B may be configured by adjusting the current gain of the differential current amplifiers 402, 404, where the current gain may be a function of the resistance ratios or inverter size ratios. The cut-off frequency of the filter circuit 400B may be configured by tuning the passive networks 414, 428—for example, tuning the resistive and/or capacitive elements of the passive networks 414, 428 with control signal(s) provided by the processor 136.

Figure 5:
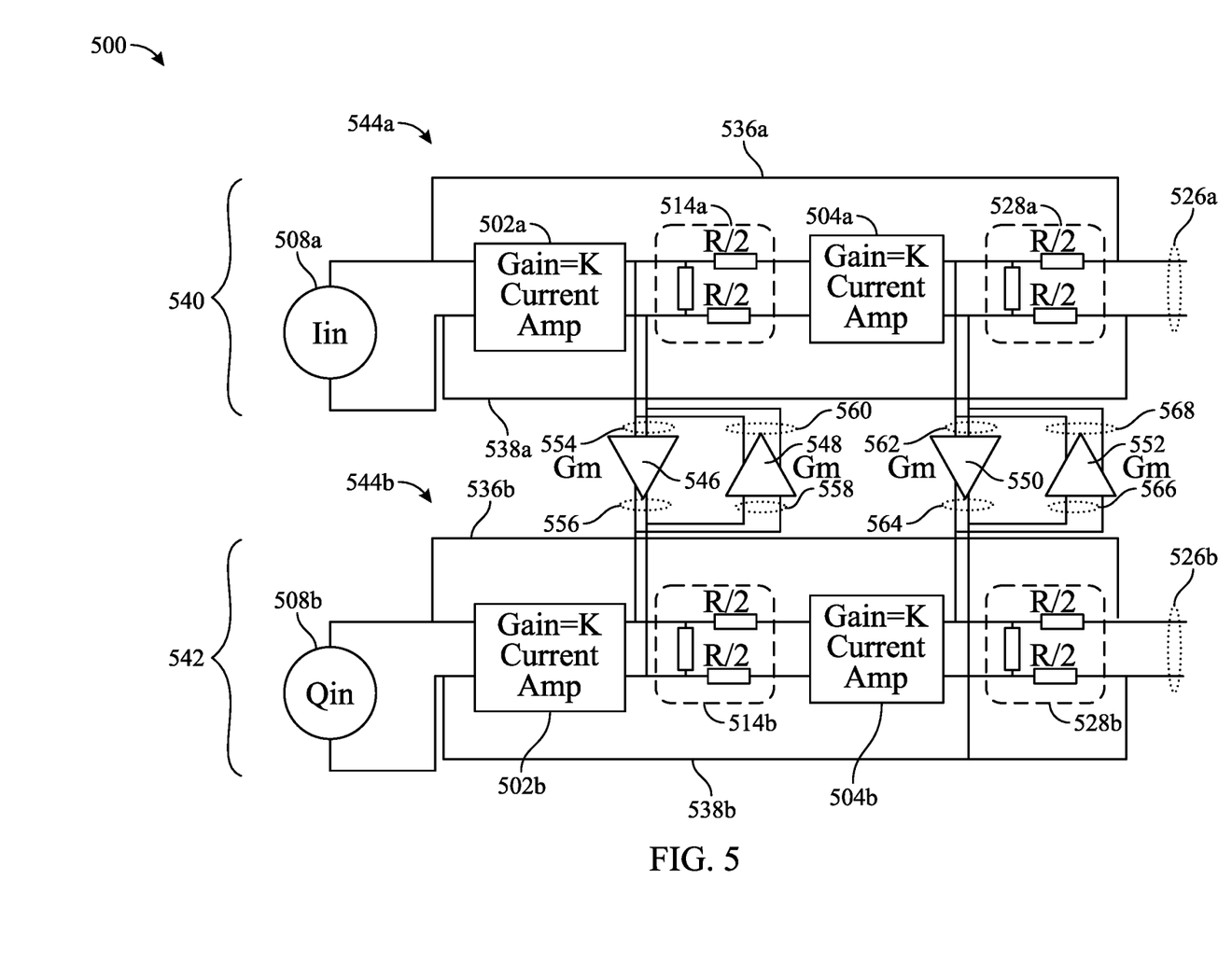
FIG. 5 is a diagram illustrating an example of a complex filter circuit including differential current-mode amplifiers.

FIG. 5 is a diagram illustrating an example of a complex filter circuit 500 including differential current amplifiers 502a, 502b, 504a, 504b, where "complex" refers to there being I and Q differential signal branches 540, 542 (e.g., differential signal paths), respectively. In this example, the complex filter circuit 500 includes a biquadratic filter circuit 544a, 544b (e.g., the filter circuit 400B) for each of the complex signal branches 540, 542. The first biquadratic filter circuit 544a includes the differential current amplifiers 502a, 504a; and the second biquadratic filter circuit 544b includes the differential current amplifiers 502b, 504b. The first biquadratic filter circuit 544a is arranged in an in-phase signal branch 540 of the filter circuit 500, and the second biquadratic filter circuit 544b is arranged in an quadrature signal branch 542 of the filter circuit 500.

The complex filter circuit 500 may include transconductance amplifiers 546, 548, 550, 552. The first transconductance amplifier 546 includes inputs 554 coupled to the differential input pair (not shown) of the first passive network 510a and includes outputs 556 coupled to the differential input pair (not shown) of a third passive network 510b. The second transconductance amplifier 548 includes inputs 558 coupled to the outputs 556 of the first transconductance amplifier 546 and includes outputs 560 coupled to the inputs 554 of the first transconductance amplifier 546.

The third transconductance amplifier 550 includes inputs 562 coupled to the differential input pair (not shown) of the second passive network 528a and includes outputs 564 coupled to the differential input pair (not shown) of a fourth passive network 528b. The fourth transconductance amplifier 552 includes inputs 566 coupled to the outputs 564 of the third transconductance amplifier 550 and includes outputs 568 coupled to the inputs 562 of the third transconductance amplifier 550.

Figure 6:
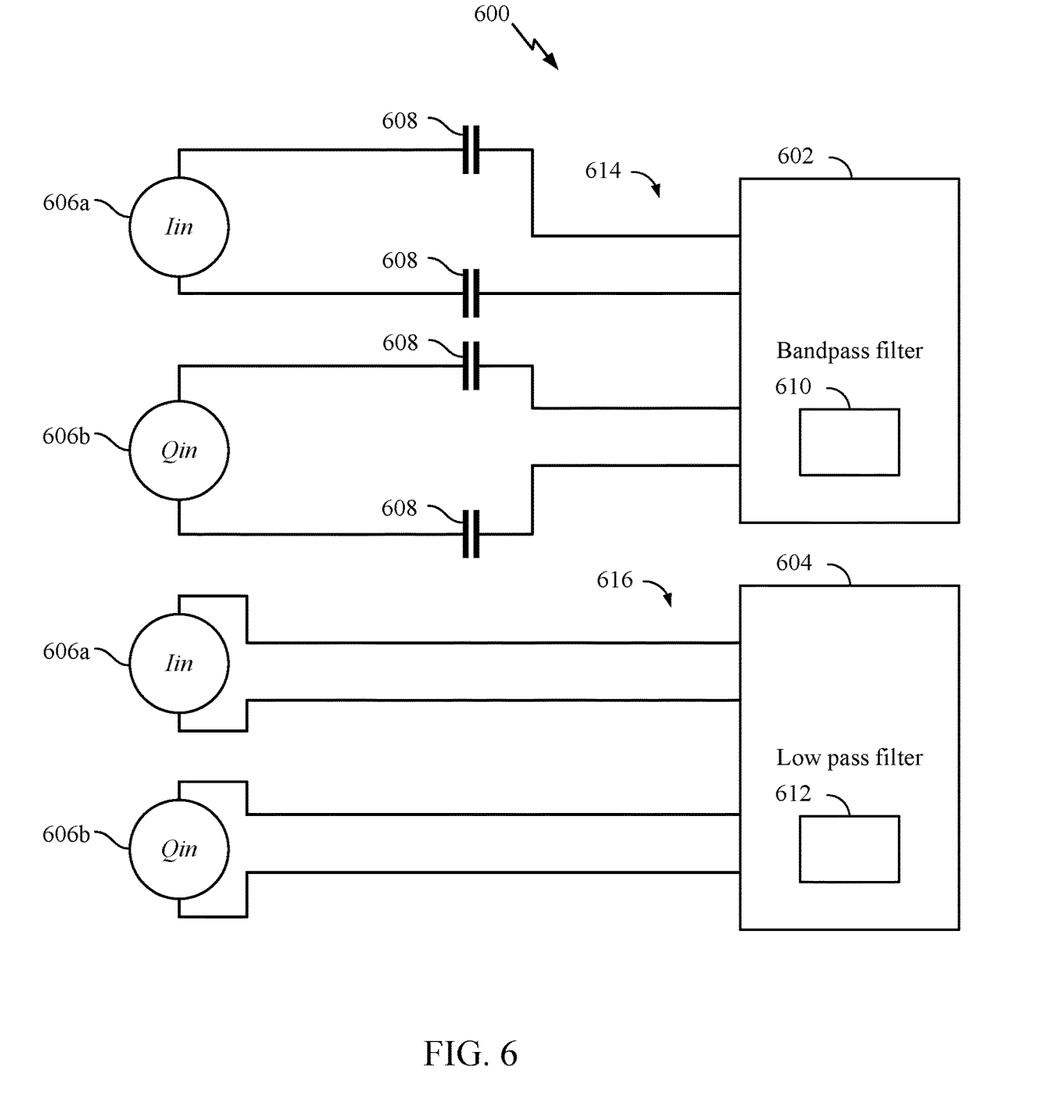
FIG. 6 is a diagram illustrating an example of a diplex filter circuit including differential current-mode amplifiers.

FIG. 6 is a diagram illustrating an example of a diplex filter circuit 600 including differential current amplifiers 610, 612. The diplex filter circuit 600 includes a first filter 602 and a second filter 604.

In this example, each of the first filter 602 and the second filter 604 is coupled to an in-phase input current 606a and a quadrature input current 606b. The first filter 602 and the second filter 604 may be coupled in parallel with each other. For example, the differential complex inputs 614 of the first filter 602 are coupled to the differential complex inputs 616 of the second filter 604. The first filter 602 may be coupled to the in-phase input current 606a and the quadrature input current 606b via capacitors 608 to facilitate alternating current (AC) coupling between the first filter 602 and the in-phase input current 606a and between the first filter 602 and the quadrature input current 606b.

The first filter 602 may include a first differential current amplifier 610. The second filter 604 may include a second differential current amplifier 612. Any of the differential current amplifier 610 and the second differential current amplifier 612 may be arranged in a filter circuit, such as the filter circuits described herein with respect to FIGS. 4A, 4B, and 5. In certain cases, the first filter 602 may be configured as a bandpass filter, and the second filter 604 may be configured as a low-pass filter. The filter circuit 600 may be configured to receive two carrier signals along a RX path—e.g., via an LNA, I-Q mixer, LO and phase-locked loop (PLL). For example, one of the carriers may be at a downconverted frequency (e.g., a baseband frequency) to zero intermediate frequency (IF), and the other carrier may be at a higher IF. The filter circuit 600 may be included in a BBF, such as the BBF 128, where the input signal to the BBF may be one carrier centered at a direct-current (DC) subcarrier (e.g., a DC subcarrier in an orthogonal frequency-division multiplexing (OFDM) system) and another carrier at a positive IF to demodulate two inter-band carriers. As an example, the bandwidth of the carrier may be 100 MHz.

Those of skill in the art will understand that the filter circuits illustrated in FIGS. 4A-6 are merely examples. Other filter circuits including differential current amplifiers may be used in addition to or instead of those illustrated, such as different passive networks as depicted, a complex filter circuit comprising other filter types including a first-order filter, second-order filter, third-order filter, etc. Any of the filter circuits described herein may be configured to operate with a power supply voltage of less than or equal to 0.8 volts, which may facilitate reduced power consumption and/or reduced node size associated with an integrated circuit. Any of the filter circuits described herein may include a baseband filter, such as the BBF 112 and/or BBF 128. In certain aspects, a radio frequency front-end (RFFE) integrated circuit (IC)—e.g., the RF transceiver circuit 100—comprises a plurality of baseband filters, where at least one of the plurality of baseband filters comprises a current-mode amplifier, for example, as described herein with respect to FIGS. 2-6.

Figure 7:
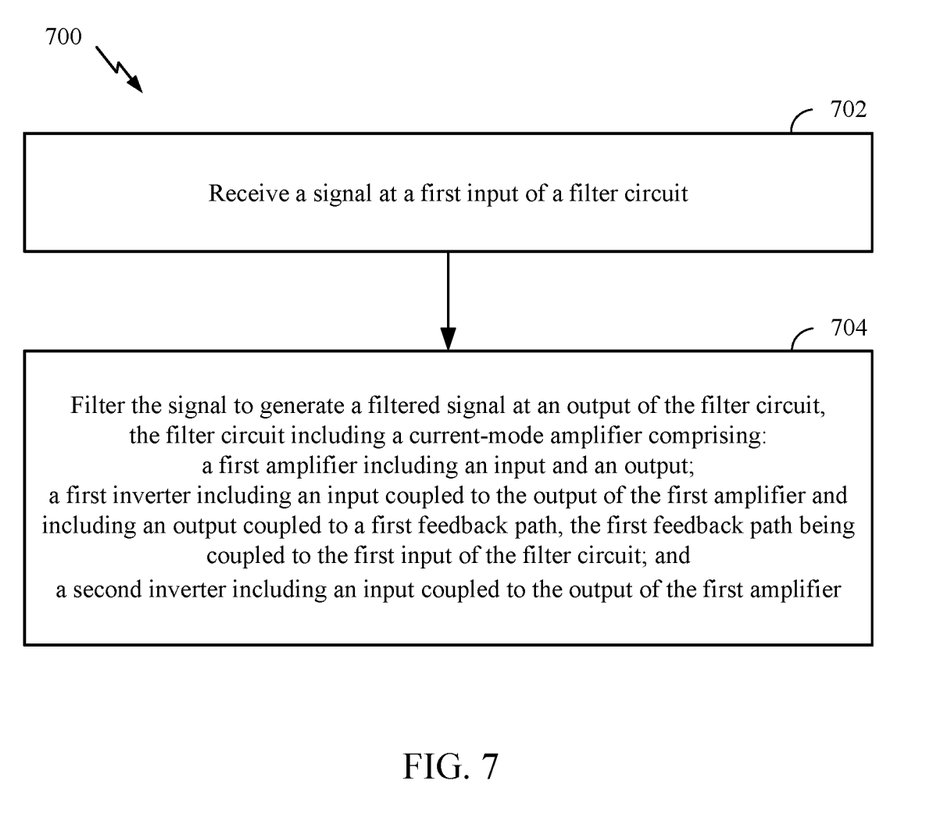
FIG. 7 is a flow diagram of example operations for signal processing.

FIG. 7 is a flow diagram of example operations 700 for signal processing. The operations 700 may be performed by a filter circuit (e.g., any of the filter circuits 400A, 400B, 500, 600). The operations 700 may be implemented as software components (e.g., computer-executable code) that are executed and run on one or more processors (e.g., the processor 136 of FIG. 1).

The operations 700 may optionally begin at block 702, where the filter circuit (e.g., any of the filter circuits 400A, 400B, 500, 600) receives a signal at a first input of the filter circuit. The signal may be an input current signal.

At block 704, the filter circuit filters the signal to generate a filtered signal at an output of the filter circuit. The filter circuit may include a current-mode amplifier comprising a first amplifier including an input and an output. The current-mode amplifier further comprises a first inverter including an input coupled to the output of the first amplifier and including an output coupled to a first feedback path, where the first feedback path is coupled to the first input of the filter circuit. The current-mode amplifier also comprises a second inverter including an input coupled to the output of the first amplifier. The filtered signal may be an output current signal. With respect to the operations 700, the filter circuit may include any of the aspects described herein with respect to FIGS. 2-6.

In certain aspects, the operations 700 may further include powering the filter circuit with a power supply voltage of less than or equal to 0.8 volts. The operations 700 may be performed by a transceiver (e.g., the RF transceiver circuit 100) with the filter circuit. For example, the transceiver may process the filtered signal for transmission and/or reception.

Example Wireless Communications Network

Figure 8:
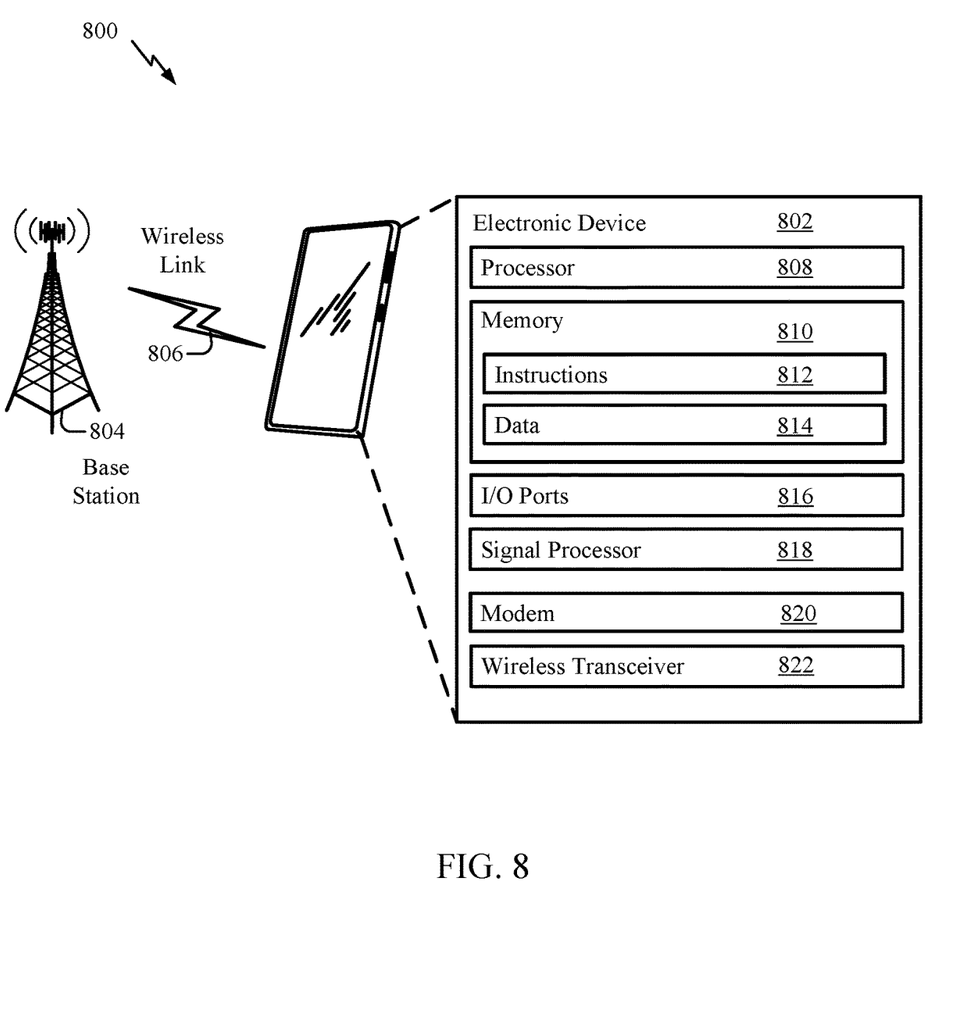
FIG. 8 is a diagram of a wireless communication network that includes a wireless communication device configured to perform analog signal processing as described herein.

In certain aspects, the apparatus and methods for current-mode analog signal filtering may be used in certain wireless communication devices in a wireless network. FIG. 8 is a diagram of a wireless communication network 800 that includes a wireless communication device 802, which has a wireless transceiver 822 such as the RF transceiver circuit 100 of FIG. 1. In certain aspects, the wireless transceiver 822 may include a filter circuit such as any of the filter circuits described herein with respect to FIGS. 4A, 4B, 5, and 6.

In the wireless communication network 800, the wireless communication device 802 communicates with a base station 804 through a wireless link 806. As shown, the wireless communication device 802 is depicted as a smartphone. However, the wireless communication device 802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, wearable device, and so forth.

The base station 804 communicates with the wireless communication device 802 via the wireless link 806, which may be implemented as any suitable type of wireless link. Although depicted as a base station tower of a cellular radio network, the base station 804 may represent or be implemented as another device, such as a satellite, terrestrial broadcast tower, access point, peer-to-peer device, mesh network node, fiber optic line, another electronic device generally as described above, and so forth. Hence, the wireless communication device 802 may communicate with the base station 804 or another device via a wired connection, a wireless connection, or a combination thereof. The wireless link 806 can include a downlink of data or control information communicated from the base station 804 to the wireless communication device 802 and an uplink of other data or control information communicated from the wireless communication device 802 to the base station 804. The wireless link 806 may be implemented using any suitable communication protocol or standard, such as 3rd Generation Partnership Project Long-Term Evolution (3GPP LTE), 3GPP New Radio Fifth Generation (NR 5G), IEEE 802.11 (WiFi), IEEE 802.16 (WiMAX), Bluetooth™, and so forth.

The wireless communication device 802 includes a processor 808 and a memory 810. The memory 810 may be or form a portion of a computer-readable storage medium. The processor 808 may include any type of processor, such as an application processor or a multi-core processor, that is configured to execute processor-executable instructions (e.g., code) stored by the memory 810. The memory 810 is configured to store instructions (e.g., computer-executable code) that when executed by the processor 808, cause the processor 808 to perform the operations 700 and/or any of the filtering operations described with respect to FIGS. 4A, 4B, 5, and 6 (e.g., adjusting any of various parameters associated with the filter including gain, phase, cut-off frequency, bandwidth, etc.), or any aspect related to such operations. The memory 810 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 810 is implemented to store instructions 812, data 814, and other information of the wireless communication device 802, and thus when configured as or part of a computer-readable storage medium, the memory 810 does not include transitory propagating signals or carrier waves. That is, the memory 810 may include non-transitory computer-readable media (e.g., tangible media).

The wireless communication device 802 may also include input/output ports 816. The I/O ports 816 enable data exchanges or interaction with other devices, networks, or users or between components of the device.

The wireless communication device 802 may further include a signal processor (SP) 818 (e.g., such as a digital signal processor (DSP)). The signal processor 818 may function similar to the processor 808 and may be capable of executing instructions and/or processing information in conjunction with the memory 810.

For communication purposes, the wireless communication device 802 also includes a modem 820, a wireless transceiver 822, and an antenna (not shown in FIG. 8). The wireless transceiver 822 provides connectivity to respective networks and other wireless communication devices connected therewith using radio frequency (RF) wireless signals, and the wireless transceiver 822 may include the RF transceiver (circuit) 100 of FIG. 1. In certain aspects, the wireless transceiver 822 may include a filter circuit including a differential current amplifier as described herein with respect to FIGS. 2-6. The wireless transceiver 822 may facilitate communication over any suitable type of wireless network, such as a wireless local area network (WLAN), a peer-to-peer (P2P) network, a mesh network, a cellular network, a wireless wide area network (WWAN), a navigational network (e.g., the global positioning system (GPS) of North America or another global navigation satellite system (GNSS)), and/or a wireless personal area network (WPAN).

Based on the present disclosure, it should be appreciated that the apparatus and the methods for current-mode analog signal filtering described herein provide various advantages. The methods and apparatus for current-mode analog signal filtering described herein may allow for a filter circuit to operate at low voltages (e.g., voltages less than or equal to 0.8 volts) and/or allow for a reduced physical size compared to an active RC filter.

Example Aspects

In addition to the various aspects described above, specific combinations of aspects are within the scope of the disclosure, some of which are detailed below:

Aspect 1: A filter circuit, comprising: a current-mode amplifier comprising: a first amplifier including an input and an output; a first inverter including an input coupled to the output of the first amplifier and including an output coupled to a first feedback path, the first feedback path being coupled to a first input of the filter circuit; and a second inverter including an input coupled to the output of the first amplifier.

Aspect 2: The filter circuit of Aspect 1, wherein the current-mode amplifier further comprises: a reference potential node; a first resistive element coupled between the output of the first inverter and the reference potential node; and a second resistive element coupled in series along the first feedback path.

Aspect 3: The filter circuit of Aspect 1 or 2, wherein the current-mode amplifier further comprises: a second amplifier including an input and an output; a third inverter including an input coupled to the output of the second amplifier and including an output coupled to a second feedback path, the second feedback path being coupled to a second input of the filter circuit; and a fourth inverter including an input coupled to the output of the second amplifier.

Aspect 4: The filter circuit of Aspect 3, wherein the current-mode amplifier further comprises a common-mode feedback circuit coupled between the output of the first amplifier and the output of the second amplifier.

Aspect 5: The filter circuit of Aspect 4, wherein: the first amplifier comprises a fifth inverter; the second amplifier comprises a sixth inverter; and the common-mode feedback circuit comprises an inverter bridge network coupled to a common-mode node.

Aspect 6: The filter circuit according to any of Aspects 3-5, wherein: the first input of the filter circuit is coupled to the input of the second amplifier, and the second input of the filter circuit is coupled to the input of the first amplifier.

Aspect 7: The filter circuit according to any of Aspects 3-6, wherein: the current-mode amplifier is a first differential current amplifier including a differential current output pair; an output of the second inverter is coupled to a first output of the differential current output pair; and an output of the fourth inverter is coupled to a second output of the differential current output pair.

Aspect 8: The filter circuit of Aspect 7, further comprising a first passive network including a differential input pair coupled to the differential current output pair of the first differential current amplifier.

Aspect 9: The filter circuit of Aspect 8, further comprising a second differential current amplifier including a differential current input pair and a differential current output pair, wherein the first passive network includes a differential output pair and wherein the differential output pair of the first passive network is coupled to the differential current input pair of the second differential current amplifier.

Aspect 10: The filter circuit of Aspect 9, wherein at least one of the first differential current amplifier or the second differential current amplifier has a variable gain.

Aspect 11: The filter circuit of Aspect 9 or 10, further comprising a second passive network including a differential input pair coupled to the differential current output pair of the second differential current amplifier.

Aspect 12: The filter circuit of Aspect 11, wherein: the second passive network further includes a differential output pair; a first output of the differential output pair of the second passive network is coupled to the first input of the filter circuit along a third feedback path; and a second output of the differential output pair of the second passive network is coupled to the second input of the filter circuit along a fourth feedback path.

Aspect 13: The filter circuit according to any of Aspects 8-12, further comprising: a second differential current amplifier including a differential current input pair and a differential current output pair; and a second passive network including a differential input pair coupled to the differential current output pair of the second differential current amplifier.

Aspect 14: The filter circuit of Aspect 13, further comprising: a first transconductance amplifier including inputs coupled to the differential input pair of the first passive network and including outputs coupled to the differential input pair of the second passive network; and a second transconductance amplifier including inputs coupled to the outputs of the first transconductance amplifier and including outputs coupled to the inputs of the first transconductance amplifier.

Aspect 15: The filter circuit of Aspect 13 or 14, wherein: the first differential current amplifier is arranged in an in-phase signal branch of the filter circuit; and the second differential current amplifier is arranged in a quadrature signal branch of the filter circuit.

Aspect 16: The filter circuit according to any of Aspects 1-15, further comprising: a first filter comprising a first differential current amplifier, wherein the first differential current amplifier comprises the current-mode amplifier; and a second filter comprising a second differential current amplifier, wherein an input of the second filter is coupled to an input of the first filter, wherein the first filter is configured as a bandpass filter, and wherein the second filter is configured as a low-pass filter.

Aspect 17: The filter circuit according to any of Aspects 1-16, wherein the first input of the filter circuit is coupled to the input of the first amplifier.

Aspect 18: The filter circuit according to any of Aspects 1-17, wherein the filter circuit is configured to operate with a power supply voltage of less than or equal to 0.8 volts.

Aspect 19: The filter circuit according to any of Aspects 1-18, wherein the filter circuit comprises a baseband filter comprising the current-mode amplifier.

Aspect 20: The filter circuit according to any of Aspects 1-19, wherein the filter circuit comprises a biquadratic filter comprising the current-mode amplifier.

Aspect 21: A radio frequency front-end (RFFE) integrated circuit (IC) comprising the filter circuit according to any of Aspects 1-20, wherein filter circuit comprises a plurality of baseband filters and wherein at least one of the plurality of baseband filters comprises the current-mode amplifier.

Aspect 22: A method of signal processing, comprising: receiving a signal at a first input of a filter circuit; and filtering the signal to generate a filtered signal at an output of the filter circuit, the filter circuit including a current-mode amplifier comprising: a first amplifier including an input and an output; a first inverter including an input coupled to the output of the first amplifier and including an output coupled to a first feedback path, the first feedback path being coupled to the first input of the filter circuit; and a second inverter including an input coupled to the output of the first amplifier.

Aspect 23: The method of Aspect 22, wherein the current-mode amplifier further comprises: a second amplifier including an input and an output; a third inverter including an input coupled to the output of the second amplifier and including an output coupled to a second feedback path, the second feedback path being coupled to a second input of the filter circuit; and a fourth inverter including an input coupled to the output of the second amplifier.

Aspect 24: The method of Aspect 23, wherein: the current-mode amplifier is a first differential current amplifier including a differential current output pair; an output of the second inverter is coupled to a first output of the differential current output pair; and an output of the fourth inverter is coupled to a second output of the differential current output pair.

Aspect 25: The method of Aspect 24, wherein the filter circuit further comprises a first passive network including a differential input pair coupled to the differential current output pair of the first differential current amplifier.

Aspect 26: The method of Aspect 25, wherein the filter circuit further comprises: a second differential current amplifier including a differential current input pair and a differential current output pair; and a second passive network including a differential input pair coupled to the differential current output pair of the second differential current amplifier.

Aspect 27: The method of Aspect 26, wherein: the first differential current amplifier is arranged in an in-phase signal branch of the filter circuit; and the second differential current amplifier is arranged in a quadrature signal branch of the filter circuit.

Aspect 28: The method according to any of Aspects 22-27, wherein the signal is an input current signal and wherein the filtered signal is an output current signal.

Aspect 29: The method according to any of Aspects 22-28, further comprising powering the filter circuit with a power supply voltage of less than or equal to 0.8 volts.

Aspect 30: An apparatus, comprising means for performing a method in accordance with any of Aspects 22-29.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, a signal may refer to a detectable physical quantity or impulse (such as a voltage, current, or magnetic field strength over time) by which messages or information can be transmitted. A signal may carry information available for observation.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The claims remain as follows:

1. A filter circuit, comprising:
a current-mode amplifier comprising:
   a first amplifier including an input and an output;
   a first inverter including an input coupled to the output of the first amplifier and including an output coupled to a first feedback path, the first feedback path being coupled to a first input of the filter circuit; and
   a second inverter including an input coupled to the output of the first amplifier.

2. The filter circuit of claim 1, wherein the current-mode amplifier further comprises:
   a reference potential node;
   a first resistive element coupled between the output of the first inverter and the reference potential node; and
   a second resistive element coupled in series along the first feedback path.

3. The filter circuit of claim 1, wherein the current-mode amplifier further comprises:
   a second amplifier including an input and an output;
   a third inverter including an input coupled to the output of the second amplifier and including an output coupled to a second feedback path, the second feedback path being coupled to a second input of the filter circuit; and
   a fourth inverter including an input coupled to the output of the second amplifier.

4. The filter circuit of claim 3, wherein the current-mode amplifier further comprises a common-mode feedback circuit coupled between the output of the first amplifier and the output of the second amplifier.

5. The filter circuit of claim 4, wherein:
   the first amplifier comprises a fifth inverter;
   the second amplifier comprises a sixth inverter; and
   the common-mode feedback circuit comprises an inverter bridge network coupled to a common-mode node.

6. The filter circuit of claim 3, wherein:
   the first input of the filter circuit is coupled to the input of the second amplifier, and
   the second input of the filter circuit is coupled to the input of the first amplifier.

7. The filter circuit of claim 3, wherein:
   the current-mode amplifier is a first differential current amplifier including a differential current output pair;
   an output of the second inverter is coupled to a first output of the differential current output pair; and
   an output of the fourth inverter is coupled to a second output of the differential current output pair.

8. The filter circuit of claim 7, further comprising a first passive network including a differential input pair coupled to the differential current output pair of the first differential current amplifier.

9. The filter circuit of claim 8, further comprising a second differential current amplifier including a differential current input pair and a differential current output pair, wherein the first passive network includes a differential output pair and wherein the differential output pair of the first passive network is coupled to the differential current input pair of the second differential current amplifier.

10. The filter circuit of claim 9, wherein at least one of the first differential current amplifier or the second differential current amplifier has a variable gain.

11. The filter circuit of claim 9, further comprising a second passive network including a differential input pair coupled to the differential current output pair of the second differential current amplifier.

12. The filter circuit of claim 11, wherein:
   the second passive network further includes a differential output pair;
   a first output of the differential output pair of the second passive network is coupled to the first input of the filter circuit along a third feedback path; and
   a second output of the differential output pair of the second passive network is coupled to the second input of the filter circuit along a fourth feedback path.

13. The filter circuit of claim 8, further comprising:
   a second differential current amplifier including a differential current input pair and a differential current output pair; and
   a second passive network including a differential input pair coupled to the differential current output pair of the second differential current amplifier.

14. The filter circuit of claim 13, further comprising:
   a first transconductance amplifier including inputs coupled to the differential input pair of the first passive network and including outputs coupled to the differential input pair of the second passive network; and
   a second transconductance amplifier including inputs coupled to the outputs of the first transconductance amplifier and including outputs coupled to the inputs of the first transconductance amplifier.

15. The filter circuit of claim 13, wherein:
   the first differential current amplifier is arranged in an in-phase signal branch of the filter circuit; and
   the second differential current amplifier is arranged in a quadrature signal branch of the filter circuit.

16. The filter circuit of claim 1, further comprising:
   a first filter comprising a first differential current amplifier, wherein the first differential current amplifier comprises the current-mode amplifier; and
   a second filter comprising a second differential current amplifier, wherein an input of the second filter is coupled to an input of the first filter, wherein the first filter is configured as a bandpass filter, and wherein the second filter is configured as a low-pass filter.

17. The filter circuit of claim 1, wherein the first input of the filter circuit is coupled to the input of the first amplifier.

18. The filter circuit of claim 1, wherein the filter circuit is configured to operate with a power supply voltage of less than or equal to 0.8 volts.

19. The filter circuit of claim 1, wherein the filter circuit comprises a baseband filter comprising the current-mode amplifier.

20. The filter circuit of claim 1, wherein the filter circuit comprises a biquadratic filter comprising the current-mode amplifier.

21. A radio frequency front-end (RFFE) integrated circuit (IC) comprising the filter circuit of claim 1, wherein filter circuit comprises a plurality of baseband filters and wherein at least one of the plurality of baseband filters comprises the current-mode amplifier.

22. A method of signal processing, comprising:
receiving a signal at a first input of a filter circuit; and
filtering the signal to generate a filtered signal at an output of the filter circuit, the filter circuit including a current-mode amplifier comprising:
　a first amplifier including an input and an output;
　a first inverter including an input coupled to the output of the first amplifier and including an output coupled to a first feedback path, the first feedback path being coupled to the first input of the filter circuit; and
　a second inverter including an input coupled to the output of the first amplifier.

23. The method of claim 22, wherein the current-mode amplifier further comprises:
　a second amplifier including an input and an output;
　a third inverter including an input coupled to the output of the second amplifier and including an output coupled to a second feedback path, the second feedback path being coupled to a second input of the filter circuit; and
　a fourth inverter including an input coupled to the output of the second amplifier.

24. The method of claim 23, wherein:
the current-mode amplifier is a first differential current amplifier including a differential current output pair;
an output of the second inverter is coupled to a first output of the differential current output pair; and
an output of the fourth inverter is coupled to a second output of the differential current output pair.

25. The method of claim 24, wherein the filter circuit further comprises a first passive network including a differential input pair coupled to the differential current output pair of the first differential current amplifier.

26. The method of claim 25, wherein the filter circuit further comprises:
　a second differential current amplifier including a differential current input pair and a differential current output pair; and
　a second passive network including a differential input pair coupled to the differential current output pair of the second differential current amplifier.

27. The method of claim 26, wherein:
the first differential current amplifier is arranged in an in-phase signal branch of the filter circuit; and
the second differential current amplifier is arranged in a quadrature signal branch of the filter circuit.

28. The method of claim 22, wherein the signal is an input current signal and wherein the filtered signal is an output current signal.

29. The method of claim 22, further comprising powering the filter circuit with a power supply voltage of less than or equal to 0.8 volts.

* * * * *